(12) United States Patent
Rawat et al.

(10) Patent No.: US 9,786,364 B1
(45) Date of Patent: Oct. 10, 2017

(54) LOW VOLTAGE SELFTIME TRACKING CIRCUITRY FOR WRITE ASSIST BASED MEMORY OPERATION

(71) Applicant: STMicroelectronics International N.V., Amsterdam (NL)

(72) Inventors: Harsh Rawat, Haryana (IN); Abhishek Pathak, Nowgong (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/381,501

(22) Filed: Dec. 16, 2016

(51) Int. Cl.
*G11C 11/00* (2006.01)
*G11C 11/419* (2006.01)
*H01L 27/11* (2006.01)
*G11C 11/412* (2006.01)

(52) U.S. Cl.
CPC ........ *G11C 11/419* (2013.01); *H01L 27/1104* (2013.01); *G11C 11/412* (2013.01)

(58) Field of Classification Search
CPC . H01L 27/1104; G11C 11/412; G11C 11/419; G11C 11/416

USPC .............................. 365/156, 154, 226, 210.1
See application file for complete search history.

(56) References Cited

U.S. PATENT DOCUMENTS

| 7,751,229 B2 | 7/2010 | Dray et al. |
| 8,335,121 B2 | 12/2012 | Dray et al. |
| 2015/0043270 A1* | 2/2015 | Singh ................... G11C 11/416 365/154 |

* cited by examiner

*Primary Examiner* — David Lam
(74) *Attorney, Agent, or Firm* — Gardere Wynne Sewell LLP

(57) ABSTRACT

Disclosed herein is an electronic device including a bit line and a complementary bit line, first and second cross coupled inverters, a first pass gate coupled between the complementary bit line and the first inverter, and a second pass gate coupled between the bit line and the second inverter. The electronic device also includes third and fourth cross coupled inverters, a third pass gate coupled between the complementary bit line and the third inverter, and a fourth pass gate coupled between the bit line and the fourth inverter. The first, second, and fourth inverters are powered between a supply node and a reference node, and the third inverter is powered between a floating node and the reference node. The first pass gate and third pass gate are coupled in parallel.

23 Claims, 5 Drawing Sheets

LOW VOLTAGE SELFTIME TRACKING CIRCUITRY FOR WRITE ASSIST BASED MEMORY OPERATION

TECHNICAL FIELD

This disclosure is related to the field of static random access memory (SRAM) arrays, and, more particularly, to a write replica path in a SRAM array to track duration of a write operation, using a supply voltage that is less than the minimum operating voltage of the SRAM array.

BACKGROUND

In a static random access memory (SRAM) array, a write replica path is used to track a duration of an actual write time in the SRAM array. This tracking is used to generate control signals for use in operating and accessing the SRAM array. It is desirable for this duration tracking to be consistent and non-varying as much as possible to provide for suitable SRAM performance.

This is of particular importance in low voltage applications where the device operating voltage is less than the operating voltage desired by the SRAM array. In these cases, conventional write replica paths are inoperable. Therefore, further development of this technology is necessary.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device including a bit line and a complementary bit line, first and second cross coupled inverters, a first pass gate coupled between the complementary bit line and the first inverter, and a second pass gate coupled between the bit line and the second inverter. The electronic device also includes third and fourth cross coupled inverters, a third pass gate coupled between the complementary bit line and the third inverter, and a fourth pass gate coupled between the bit line and the fourth inverter. The first, second, and fourth inverters are powered between a supply node and a reference node, and the third inverter is powered between a floating node and the reference node. The first pass gate and third pass gate are coupled in parallel.

Also disclosed herein is an SRAM cell that includes a first PMOS transistor having a source coupled to a supply node, a drain coupled to a first node, and a gate coupled to a second node. A first NMOS transistor has a drain coupled to the first node, a source coupled to a reference node, and a gate coupled to the second node. A second PMOS transistor has a source coupled to the supply node, a drain coupled to the second node, and a gate coupled to the first node. A second NMOS transistor has a drain coupled to the second node, a source coupled to the reference node, and a gate coupled to the first node. A third PMOS transistor has a source coupled to a floating node, a drain coupled to the first node, and a gate coupled to the second node. A third NMOS transistor has a drain coupled first node, a source coupled to the reference node, and a gate coupled to the second node. A fourth PMOS transistor has a source coupled to the supply node, a drain coupled to the second node, and a gate coupled to the first node. A fourth NMOS transistor has a drain coupled to the second node, a source coupled to the reference node, and a gate coupled to the first node.

Also disclosed herein is an SRAM array including an array of SRAM memory cells, with a dummy column at a periphery of the array of SRAM memory cells. The dummy column includes at least a bit line and a complementary bit line, first and second cross coupled inverters, a first pass gate coupled between the complementary bit line and the first inverter, and a second pass gate coupled between the bit line and the second inverter. The dummy column also includes third and fourth cross coupled inverters, a third pass gate coupled between the complementary bit line and the third inverter, and a fourth pass gate coupled between the bit line and the fourth inverter. The first, second, and fourth inverters are powered between a supply node and a reference node, and the third inverter is powered between a floating node and the reference node. The first pass gate and third pass gate are coupled in parallel. The first, second, third, and fourth pass gates are selectively opened and closed as a function of a word line signal, such that when the first and third pass gates are closed to thereby couple outputs of the first and third inverters to the complementary bit line, due to the third inverter being powered between the floating node and the reference node, the first and third pass gates are able to pull the outputs of the first and third inverters low, thereby resulting in inputs of the second and fourth inverters being charged to high.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout.

Figure 1:
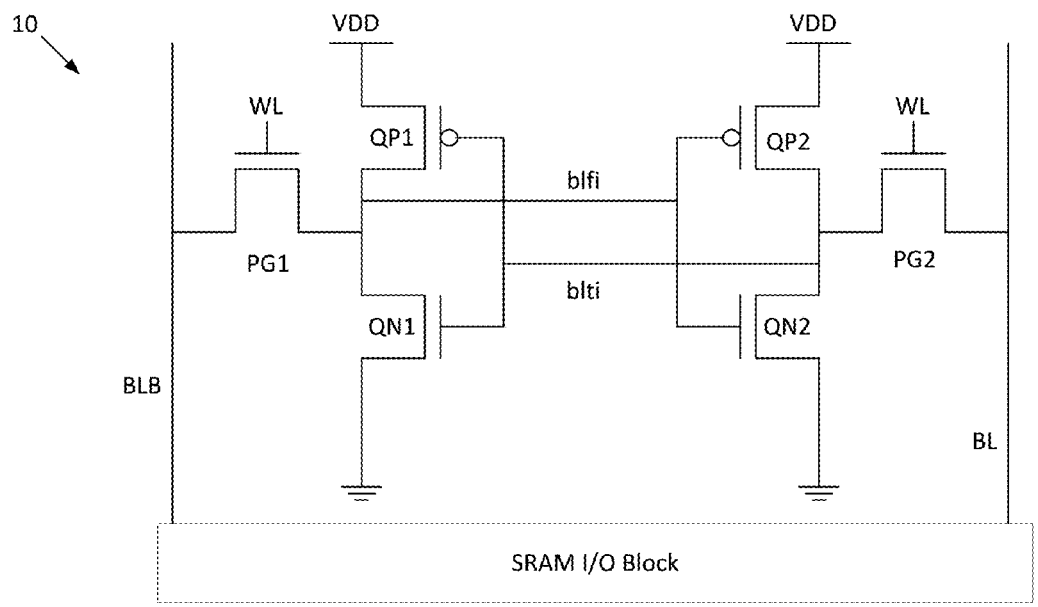
FIG. 1 is a sample SRAM memory cell.

A SRAM cell write one operation 10 is now described with reference to FIG. 1. Pass gate PG1 transistor has its source coupled to BLB, its drain coupled to complementary storage node blfi, and its gate coupled to word line WL. PMOS transistor QP1 has its source coupled to the power supply node VDD, its drain coupled to complementary storage node blfi, and its gate coupled to storage node blti. NMOS transistor QN1 has its drain coupled to complementary storage node blfi, its source coupled to ground, and its gate coupled to storage node blti.

Pass gate PG2 transistor has its drain coupled to bit line BL, its source coupled to storage node blti, and its gate coupled to WL. PMOS transistor QP2 has its source coupled to VDD, its drain coupled to storage node blti and its gate coupled to blfi. NMOS transistor QN2 has its drain coupled to storage node blti, its source coupled to ground, and its gate coupled to complementary storage node blfi. Bit line BL is coupled to VDD.

Those skilled in the art will recognize that QP1 and QN1 form a first inverter having an input at the gates thereof and an output at the drains thereof. QP2 and QN2 form a second inverter having an input at the gates thereof and an output at the drains thereof. These inverters are cross coupled to form a latch.

Figure 2:
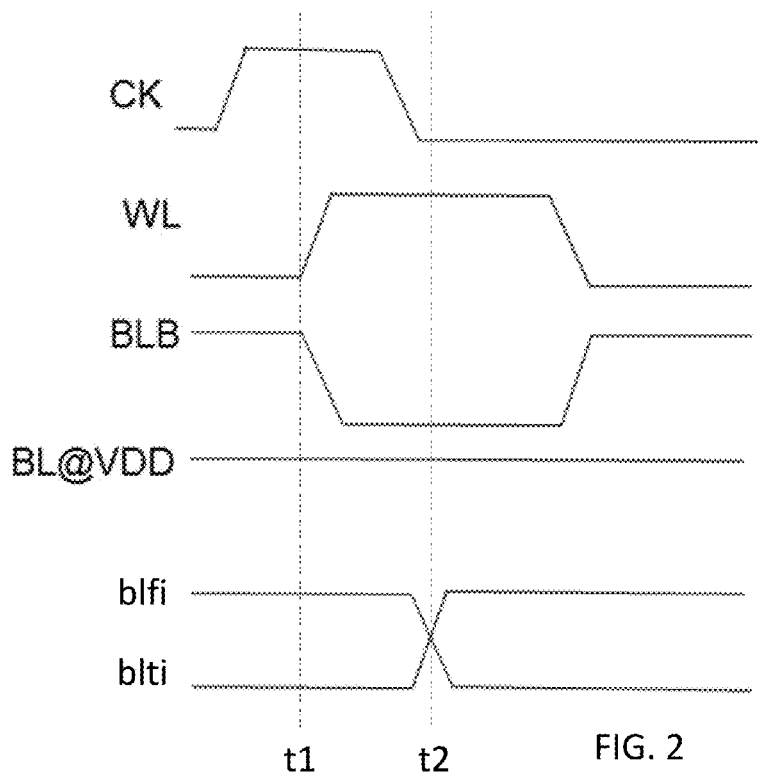
FIG. 2 is a timing diagram of the SRAM memory cell of FIG. 1 in operation.

Operation is now described with additional reference to the timing diagram shown in FIG. 2. Initially, blfi is high, while blti is low, for example. This means that initially, QP1 is on, QN1 is off, QP2 is off, and QN2 is on.

When a write 1 operation is initiated, BLB is pulled low by write driver inside the input output (IO) logic of memory at time t1 as shown in FIG. 2. When word line WL is asserted, pass gates PG1 and PG2 are turned on. This results in BLB pulling blfi low when WL goes high, as shown in FIG. 2 at time t2. BL is maintained at VDD through write circuit in IO block. Those skilled in the art will understand the write driver logic inside the IO block. Similarly in case of write 0, BL is pulled low and BLB is maintained at VDD.

Blfi going low in turn pulls the gates of QP2 and QN2 low, resulting in QP2 turning on and QN2 turning off. QP2 being on while QN2 is off serves to charge storage node blti high. Blti being high drives the gates of QP1 and QN2 high, resulting in QP1 turning off and QN1 turning on, further pulling blfi low.

It should be appreciated that when PG1 initially turns on, it is fighting to pull down blfi against the pulling or charging up provided by QP1. This "fight" or "tug of war" continues over the propagation time involved for QP2 and QN2 to switch. If the pulling down provided by PG1 is insufficient to overcome the pulling up provided by QP1, QP2 and QN2 will be unable to switch, and the SRAM array 10 will effectively be inoperable.

Figure 6:
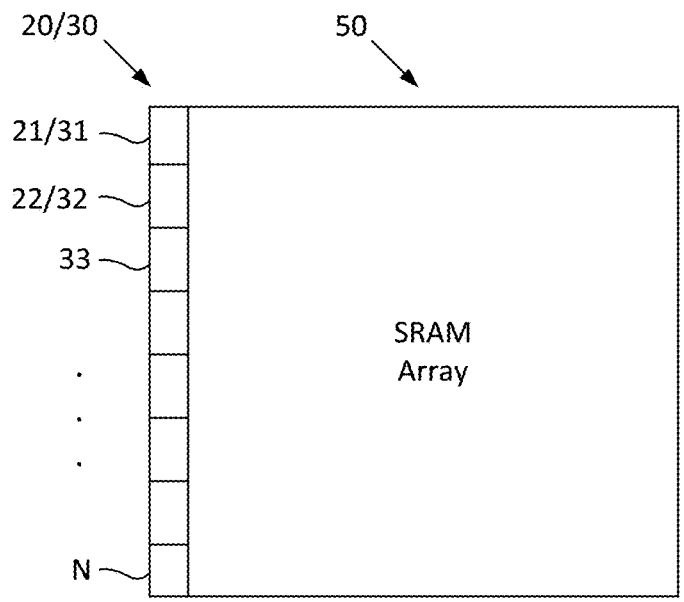
FIG. 6 shows the dummy columns of FIG. 3 or FIG. 5 used about the periphery of a SRAM array.

This is an undesirable situation. As explained, such SRAM cells 10 may be used in a dummy write column in a SRAM array. Therefore, shown in the SRAM array 50 (as shown in FIG. 6) are dummy write SRAM columns 20 or 30, including N dummy SRAM cells, such as dummy SRAM cells 21 or 31, 22 or 32, 23 or 33, modified to allow the pass gates PG1 and PG3 to pull down against only QP1. This SRAM cell 20 is now described.

The SRAM cell 20 includes a dummy write driver DWD coupled to dummy complementary dummy bit line DBLB. Pass gate PG1 transistor has its source coupled to DBLB, its drain coupled to complementary storage node blbi1, and its gate coupled to dummy word line DWL. PMOS transistor QP1 has its source coupled to the power supply node VDD, its drain coupled to complementary storage node blbi1, and its gate coupled to storage node bli1. NMOS transistor QN1 has its drain coupled to complementary storage node blbi1, its source coupled to ground, and its gate coupled to storage node bli1.

Pass gate PG2 transistor has its drain coupled to dummy bit line DBL, its source coupled to storage node bli1, and its gate coupled to WL. PMOS transistor QP2 has its source coupled to VDD, its drain coupled to storage node bli1, and its gate coupled to blbi1. NMOS transistor QN2 has its drain coupled to storage node bli1, its source coupled to ground, and its gate coupled to complementary storage node blbi1. Dummy bit line DBL is coupled to VDD.

QP1 and QN1 form a first inverter having an input bli1 at the gates thereof and an output blbi1 at the drains thereof. QP2 and QN2 form a second inverter having an input bli1 at the gates thereof and an output blbi1 at the drains thereof. These inverters are cross coupled to form a latch.

Pass gate PG3 transistor has its source coupled to DBLB, its drain coupled to complementary storage node blbi2, and its gate coupled to the dummy word line DWL. PMOS transistor QP3 has its source coupled to a floating node FL that is left floating and coupled to neither VDD nor ground, its drain coupled to complementary storage node blbi2, and its gate coupled to storage node bli2. NMOS transistor QN3 has its drain coupled to complementary storage node blbi2, its source coupled to ground, and its gate coupled to storage node bli2.

Pass gate PG4 transistor has its drain coupled to dummy bit line DBL, its source coupled to storage node bli2, and its gate coupled to dummy word line DWL. PMOS transistor QP4 has its source coupled to VDD, its drain coupled to storage node bli2, and its gate coupled to blbi2. NMOS transistor QN4 has its drain coupled to storage node bli2, its source coupled to ground, and its gate coupled to complementary storage node blbi2. Dummy bit line DBL is coupled to VDD.

Pass gates PG1 and PG3 are coupled in parallel, as are pass gates PG2 and PG4. By coupled in parallel here, it is meant that the sources of PG1 and PG3 are coupled, as are the sources of PG2 and PG4; likewise, the drains of PG1 and PG3 are coupled, as are the drains of PG2 and PG4; similarly, the gates of PG1 and PG3 are coupled, as are the gates of PG2 and PG4.

QP3 and QN3 form a third inverter having an input bli2 at the gates thereof and an output blbi2 at the drains thereof. QP4 and QN4 form a fourth inverter having an input bli2 at the gates thereof and an output blbi2 at the drains thereof. These inverters are cross coupled to form a latch.

Figure 4:
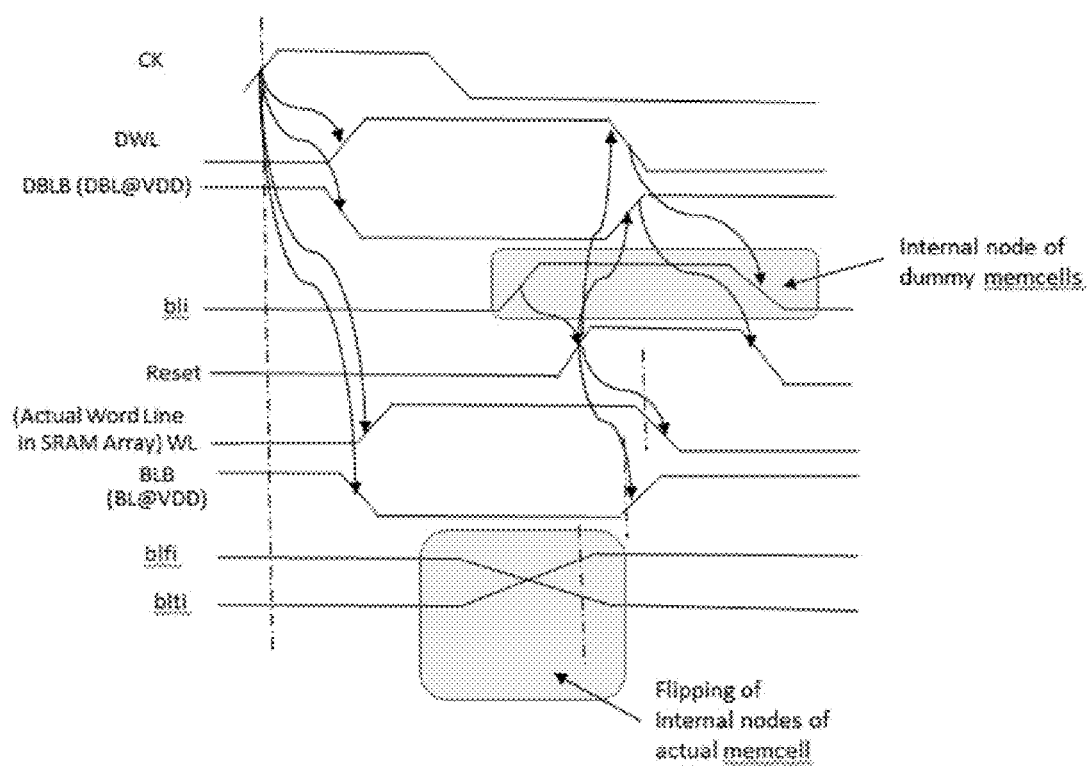
FIG. 4 is a timing diagram of the SRAM column of FIG. 3 in operation.

Operation is now described with additional reference to the timing diagram shown in FIG. 4. Initially, blbi1 is high, while bli1 and bli2 are low, for example. This means that initially, QP1 is weakly on, QN1 is off, QP2 is off, and QN2 is on.

Figure 3:
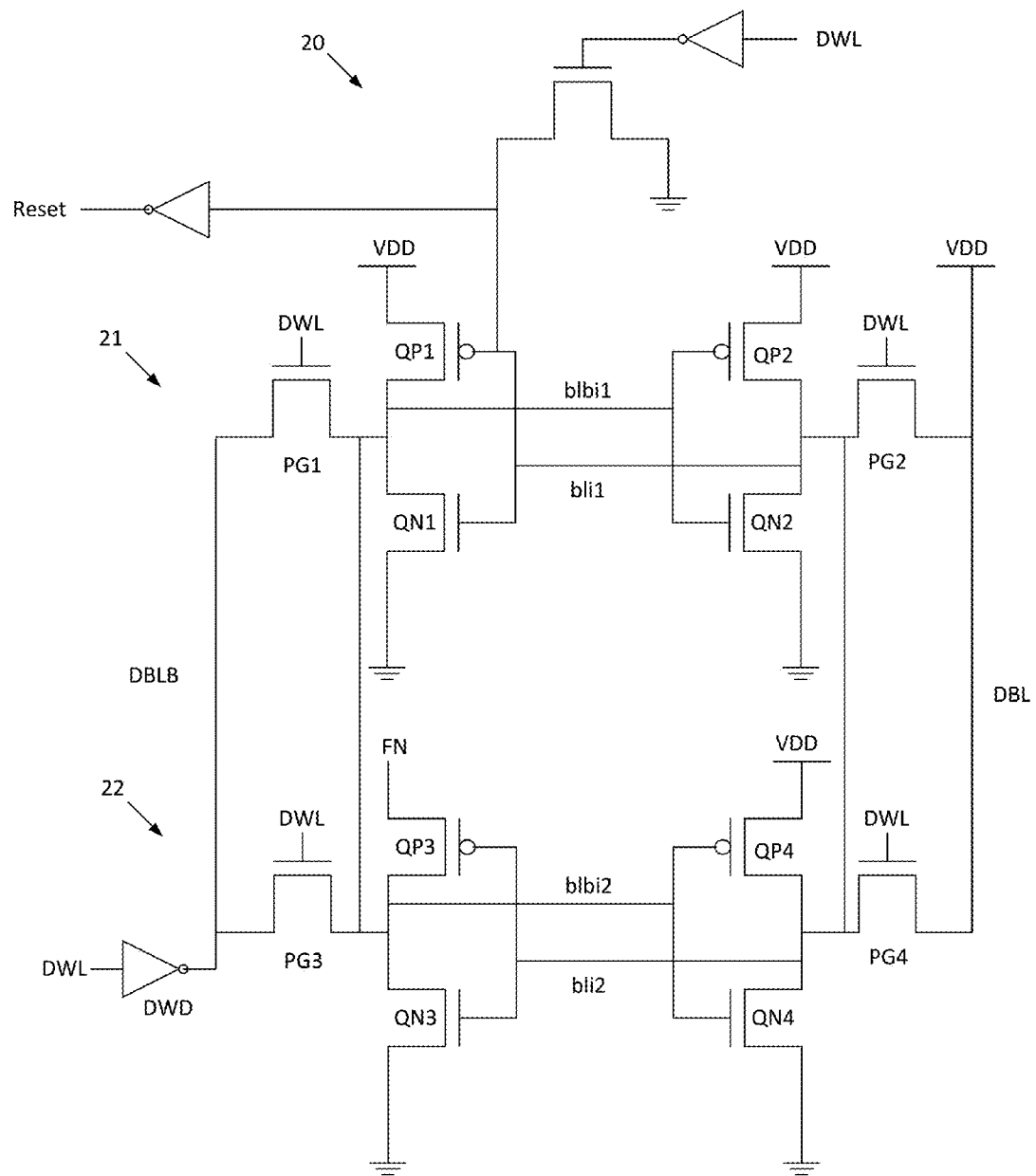
FIG. 3 is a dummy SRAM column incorporating techniques and circuits described herein.
Figure 5:
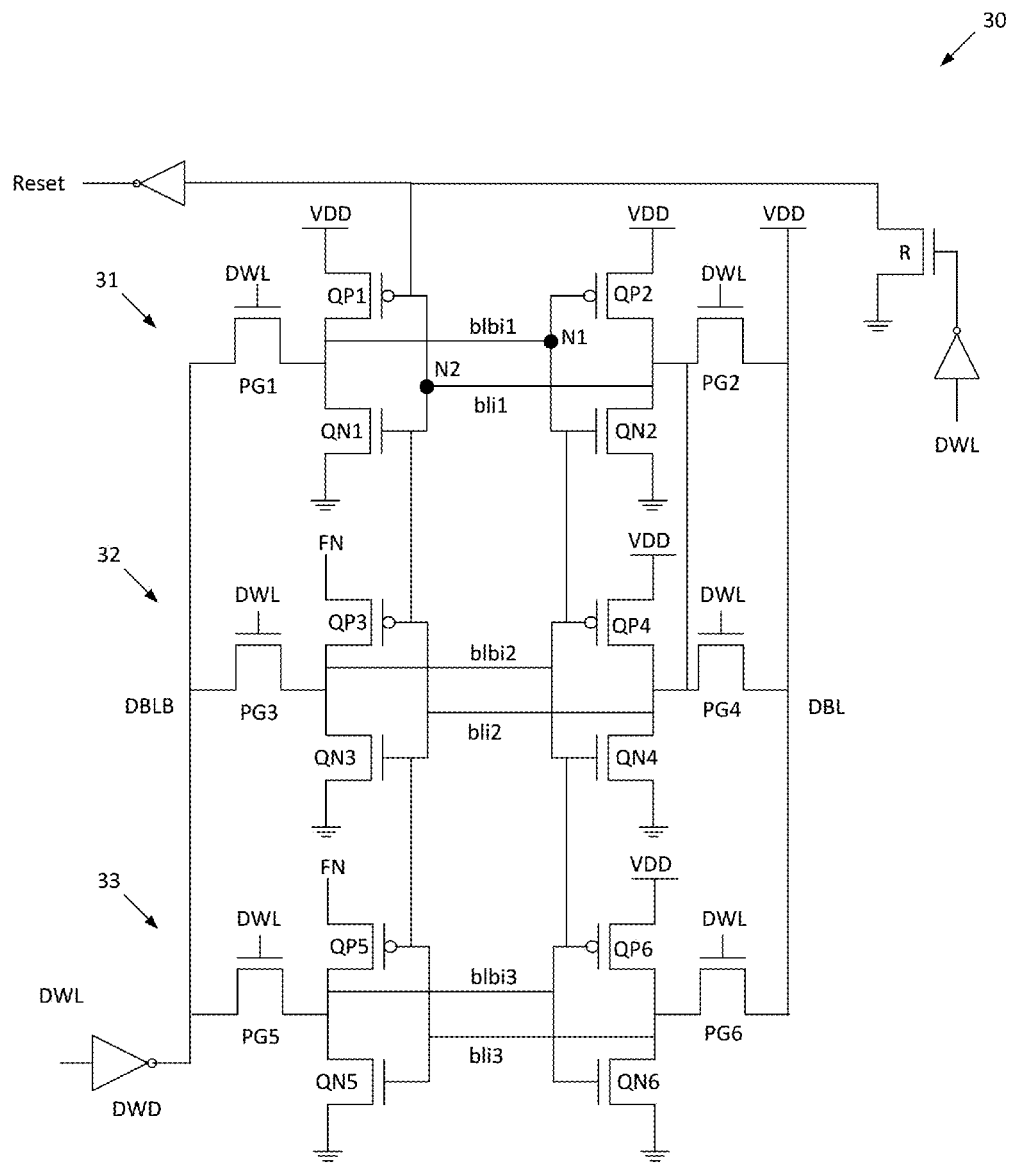
FIG. 5 is another dummy SRAM column incorporating techniques and circuits described herein.

When a write operation is initiated, dummy write driver DWD is turned on which in turn pulls the DBLB down. The turning on of DWD is usually controlled through the same signal which turns on the write driver which pulls either of BL or BLB to ground (depending on the data to be written) in the actual IO, which enables the write inside the actual memory core through WL. One of the ways of turning on the DWD can also be through DWL as shown in FIG. 3 and FIG. 5. Those skilled in the art will understand that there can be different ways of controlling the DWD but this disclosure is focused not on DWD controlling signal, but on making the dummy memcells writable by increasing the number of PG fighting with the pull up of the latches. When DWL is asserted pass gates PG1, PG2, PG3, and PG4 are turned on. PG1 and PG3, due to being coupled in parallel, together pull down against the pull up provided by QP1, and the weak pullup, if any, provided by QP3. Therefore, the successful pulling of blbi1 low by PG1 and PG3, when DWL goes high as shown in FIG. 4, is assured through this design. After DWL returns low, blbi1 and blbi2 return to being high, and bli1 and bli2 return to being low.

In some applications, it may be desirable to have three pass gates pull down against the pull up provided by QP1, and thus a dummy column 30 (as shown in FIG. 5) may have two SRAM cells 32 and 33 where the first inverter (left side inverter, as shown in the drawings) has a PMOS with a source left floating per every SRAM cell 31 where the first inverter has the source of its PMOS coupled to VDD. In such samples, the pass gates of each first inverter may be coupled in parallel, while the pass gates of each second inverter may also be coupled in parallel.

It should be appreciated that in FIG. 5 but one sample set of three cells 31-33 is shown, but it to be understood there may be any number of such sets.

In the column 30 shown in FIG. 5, there is additionally a pass gate PG5 transistor having its source coupled to DBLB, its drain coupled to complementary storage node blbi3, and its gate coupled to the dummy word line DWL. PMOS transistor QP5 also has its source coupled to a floating node FL that is left floating and coupled to neither VDD nor ground, its drain coupled to complementary storage node blbi3, and its gate coupled to storage node bli3. NMOS transistor QN5 has its drain coupled to complementary storage node blbi3, its source coupled to ground, and its gate coupled to storage node bli3.

Pass gate PG6 transistor has its drain coupled to dummy bit line DBL, its source coupled to storage node bli3, and its gate coupled to dummy word line DWL. PMOS transistor QP6 has its source coupled to VDD, its drain coupled to storage node bli3, and its gate coupled to blbi3. NMOS transistor QN6 has its drain coupled to storage node bli3, its source coupled to ground, and its gate coupled to complementary storage node blbi3. Dummy bit line DBL is coupled to VDD.

Also, as shown in FIG. 5, rather than the pass gates PG1, PG3, PG5 being coupled in parallel, and rather than pass gates PG2, PG4, and PG6 being coupled in parallel, blbi1, blbi2, and blbi3 can be coupled at node N1, while bli1, bli2, and bli3 can be coupled at node N2. While the functional effect is the same or similar, this is an alternate layout arrangement.

QP5 and QN4 form a third inverter having an input at the gates thereof and an output at the drains thereof. QP6 and QN6 form a fourth inverter having an input at the gates thereof and an output at the drains thereof. These inverters are cross coupled to form a latch.

In the circuit 30 of FIG. 5, when dummy word line DWL is asserted, pass gates PG5 and PG5 are also turned on. PG1, PG3, and PG5 due to being coupled in parallel, together pull down against the pull up provided by QP1, and the weak pullup, if any, provided by QP3 and QP5. Therefore, the successful pulling of blbi1 low by PG1, PG3, and PG5 when DWL goes low is assured through this design.

Thus, it is to be understood that there may be any ratio of dummy SRAM cells with their first inverter having the source of its PMOS left floating to dummy SRAM cells with their first inverter having the source of its PMOS coupled to VDD, thus allowing the setting of a ratio of pass gates pulling down to first inverter PMOSs pulling up.

Referring now back to FIG. 3, blbi1 going low in turn pulls the gates of QP2 and QN2 low, resulting in QP2 turning on and QN2 turning off. QP2 being on while QN2 is off serves to charge storage node bli1 to high. Bli1 being high drives the gates of QP1 and QN1 high, resulting in QP1 turning off and QN1 turning on, further pulling blbi1 low.

Similarly, blbi2 is pulled low by PG1 and PG3, which in turn pulls the gates of QP4 and QN4 low, resulting in QP4 turning on and QN4 turning off. QP4 being on while QN4 is off serves to charge storage node bli2 to high. Bli2 being high drives the gates of QP3 and QN3 high, resulting in QP3 turning off and QN3 turning on, further pulling blbi2 low.

The SRAM cell 20 can be used to generate a reset signal for a SRAM array. To that end, a reset NMOS transistor R can have its source coupled to ground, its drain coupled to storage node bli (shown as dummy cell internal node in the timing diagram of FIG. 4), and its gate coupled to an inverse of the dummy word line DWL. When dummy word line DWL is asserted, as shown in FIG. 4, NMOS transistor R is shut off, and bli is inverted and output as the reset signal.

When dummy write DWL resets, as shown in FIG. 4, DBLB returns to logic high level, and DBL remains high and the pass gates PG1, PG2, PG3, PG4 open, storing the new values on blbi and bli.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. An electronic device, comprising:
   a bit line and a complementary bit line;
   first and second cross coupled inverters;
   a first pass gate coupled between the complementary bit line and the first inverter;
   a second pass gate coupled between the bit line and the second inverter;
   third and fourth cross coupled inverters;
   a third pass gate coupled between the complementary bit line and the third inverter; and
   a fourth pass gate coupled between the bit line and the fourth inverter;
   wherein the first, second, and fourth inverters are powered between a supply node and a reference node, and the third inverter is powered between a floating node and the reference node;
   wherein the first pass gate and third pass gate are coupled in parallel.

2. The electronic device of claim 1, wherein the bit line is coupled to the supply node; and further comprising a drive configured to selectively couple the complementary bit line to ground.

3. The electronic device of claim 1, wherein the first, second, third, and fourth pass gates are selectively opened and closed as a function of a word line signal, such that when the first and third pass gates are closed to thereby couple outputs of the first and third inverters to the complementary bit line, due to the third inverter being powered between the floating node and the reference node, the first and third pass gates are able to pull the outputs of the first and third inverters low, thereby resulting in inputs of the second and fourth inverters being charged to high.

4. The electronic device of claim 3, further comprising a reset node coupled to an input of the first inverter, and wherein a reset timer signal is generated on the reset node when the input of the first inverter is charged to high.

5. The electronic device of claim 1, wherein the second pass gate and fourth pass gate are coupled in parallel.

6. The electronic device of claim 1, further comprising:
   fifth and sixth cross coupled inverters;
   a fifth pass gate coupled between the complementary bit line and the fifth inverter; and
   a sixth pass gate coupled between the bit line and the sixth inverter;
   wherein the sixth inverter is powered between the supply node and the reference node, and the fifth inverter is powered between a floating node and the reference node;
   wherein the fifth pass gate is coupled in parallel with the first pass gate and third pass gate.

7. The electronic device of claim 1, wherein:
   the first inverter comprises:

a first PMOS transistor having a source coupled to the supply node, a drain coupled to an output of the first inverter, and a gate coupled to an input node of the first inverter; and a first NMOS transistor having a drain coupled to the output of the first inverter, a source coupled to the reference node, and a gate coupled to the input node of the first inverter;

the second inverter comprises:

a second PMOS transistor having a source coupled to the supply node, a drain coupled to an output of the second inverter, and a gate coupled to an input node of the second inverter; and a second NMOS transistor having a drain coupled to the output of the second inverter, a source coupled to the reference node, and a gate coupled to the input node of the second inverter;

wherein the output of the first inverter is coupled to the input node of the second inverter;

wherein the output of the second inverter is coupled to the input node of the first inverter.

8. The electronic device of claim 7, wherein:

the third inverter comprises:

a third PMOS transistor having a source coupled to the floating node, a drain coupled to an output of the third inverter, and a gate coupled to an input node of the third inverter; and a third NMOS transistor having a drain coupled to the output of the third inverter, a source coupled to the reference node, and a gate coupled to the input node of the third inverter;

the fourth inverter comprises:

a fourth PMOS transistor having a source coupled to the supply node, a drain coupled to an output of the fourth inverter, and a gate coupled to an input node of the fourth inverter; and a fourth NMOS transistor having a drain coupled to the output of the fourth inverter, a source coupled to the reference node, and a gate coupled to the input node of the fourth inverter;

wherein the output of the third inverter is coupled to the input node of the fourth inverter;

wherein the output of the fourth inverter is coupled to the input node of the third inverter.

9. The electronic device of claim 8, wherein the first pass gate is coupled between the complementary bit line and the output of the first inverter, and selectively couples the complementary bit line to the output of the first inverter as a function of a word line signal; wherein the second pass gate is coupled between the bit line and the output of the second inverter, and selectively couples the bit line to the output of the second inverter as a function of the word line signal; wherein the third pass gate is coupled between the complementary bit line and the output of the third inverter and selectively couples the complementary bit line to the output of the third inverter as a function of the word line signal; wherein the fourth pass gate is coupled between the bit line and the output of the fourth inverter, and selectively couples the bit line to the output of the fourth inverter as a function of the word line signal; and wherein the first and third pass gates are coupled in parallel.

10. The electronic device of claim 9, further comprising:

a reset node coupled to the input of the first inverter;

a reset transistor having a source coupled to the reference node, a drain coupled to the reset node, and a gate coupled to receive an inverse of the word line signal; and an inverter having an input coupled to the reset node and an output configured to generate a reset timer signal when the input of the first inverter is charged to high.

11. The electronic device of claim 9, further comprising:

fifth and sixth cross coupled inverters;

a fifth pass gate coupled between the complementary bit line and the fifth inverter; and a sixth pass gate coupled between the bit line and the sixth inverter;

wherein the fifth inverter comprises:

a fifth PMOS transistor having a source coupled to the floating node, a drain coupled to an output of the fifth inverter, and a gate coupled to an input node of the fifth inverter; and a fifth NMOS transistor having a drain coupled to the output of the fifth inverter, a source coupled to the reference node, and a gate coupled to the input node of the fifth inverter;

the sixth inverter comprises:

a sixth PMOS transistor having a source coupled to the supply node, a drain coupled to an output of the sixth inverter, and a gate coupled to an input node of the sixth inverter; and a sixth NMOS transistor having a drain coupled to the output of the sixth inverter, a source coupled to the reference node, and a gate coupled to the input node of the sixth inverter;

wherein the output of the fifth inverter is coupled to the input node of the sixth inverter;

wherein the output of the sixth inverter is coupled to the input node of the fourth inverter.

12. The electronic device of claim 11, wherein the fifth and sixth cross coupled inverters and fifth and sixth cross coupled pass gates are instantiated in parallel to the bit line and complementary bitline in dependence on SRAM design parameters.

13. The electronic device of claim 11, wherein the fifth pass gate is coupled between the complementary bit line and the output of the fifth inverter, and selectively couples the complementary bit line to the output of the fifth inverter as a function of a word line signal; wherein the sixth pass gate is coupled between the bit line and the output of the sixth inverter, and selectively couples the bit line to the output of the sixth inverter as a function of the word line signal; and wherein the fifth pass gate is coupled in parallel with the first pass gate and third pass gate.

14. The electronic device of claim 11, wherein a dummy column is defined by the fifth and sixth cross coupled inverters and fifth and sixth pass gates coupled in parallel between the bit line and the complementary bitline.

15. An SRAM cell, comprising:

a first PMOS transistor having a source coupled to a supply node, a drain coupled to a first node, and a gate coupled to a second node;

a first NMOS transistor having a drain coupled to the first node, a source coupled to a reference node, and a gate coupled to the second node;

a second PMOS transistor having a source coupled to the supply node, a drain coupled to the second node, and a gate coupled to the first node;

a second NMOS transistor having a drain coupled to the second node, a source coupled to the reference node, and a gate coupled to the first node;

a third PMOS transistor having a source coupled to a floating node, a drain coupled to the first node, and a gate coupled to the second node;

a third NMOS transistor having a drain coupled first node, a source coupled to the reference node, and a gate coupled to the second node;
a fourth PMOS transistor having a source coupled to the supply node, a drain coupled to the second node, and a gate coupled to the first node; and
a fourth NMOS transistor having a drain coupled to the second node, a source coupled to the reference node, and a gate coupled to the first node.

16. The SRAM cell of claim 15, further comprising:
a first pass gate coupled between a complementary bit line and the first node, and selectively coupling the complementary bit line to first node as a function of a word line signal;
a second pass gate coupled between a bit line and second node, and selectively coupling the bit line to the second node as a function of the word line signal;
a third pass gate coupled between the complementary bit line and the first node and selectively coupling the complementary bit line to the first node as a function of the word line signal; and
a fourth pass gate coupled between the bit line and the second node, and selectively coupling the bit line to the second node as a function of the word line signal.

17. The SRAM cell of claim 16, further comprising:
a fifth PMOS transistor having a source coupled to the floating node, a drain coupled to the first node, and a gate coupled to the second node;
a fifth NMOS transistor having a drain first node, a source coupled to the reference node, and a gate coupled to the second node;
a sixth PMOS transistor having a source coupled to the supply node, a drain coupled to the second node, and a gate coupled to the first node; and
a sixth NMOS transistor having a drain coupled to the second node, a source coupled to the reference node, and a gate coupled to the first node.

18. The SRAM cell of claim 17, further comprising:
a fifth pass gate coupled between the complementary bit line and the first node, and selectively coupling the complementary bit line to the first node as a function of the word line signal; and
a sixth pass gate coupled between the bit line and the second node, and selectively coupling the bit line to the second node as a function of the word line signal.

19. The SRAM cell of claim 16, further comprising:
a reset node coupled to the second node;
a reset transistor having a source coupled to the reference node, a drain coupled to the reset node, and a gate coupled to receive an inverse of the word line signal; and
an inverter having an input coupled to the reset node and an output configured to generate a reset timer signal when the second node is charged to high.

20. The SRAM cell of claim 16, wherein when the first and third pass gates are closed to thereby couple outputs of the first node to the complementary bit line, due to the third PMOS transistor having its source coupled to the floating node, the first and third pass gates are able to pull the first node low, thereby resulting in the second node being charged to high.

21. An SRAM array, comprising:
an array of SRAM memory cells;
a dummy column at a periphery of the array of SRAM memory cells, the dummy column comprising at least:
a bit line and a complementary bit line;
first and second cross coupled inverters;
a first pass gate coupled between the complementary bit line and the first inverter;
a second pass gate coupled between the bit line and the second inverter;
third and fourth cross coupled inverters;
a third pass gate coupled between the complementary bit line and the third inverter; and
a fourth pass gate coupled between the bit line and the fourth inverter;
wherein the first, second, and fourth inverters are powered between a supply node and a reference node, and the third inverter is powered between a floating node and the reference node;
wherein the first pass gate and third pass gate are coupled in parallel;
wherein the first, second, third, and fourth pass gates are selectively opened and closed as a function of a word line signal, such that when the first and third pass gates are closed to thereby couple outputs of the first and third inverters to the complementary bit line, due to the third inverter being powered between the floating node and the reference node, the first and third pass gates are able to pull the outputs of the first and third inverters low, thereby resulting in inputs of the second and fourth inverters being charged to high.

22. The SRAM array of claim 21, further comprising a reset node coupled to an input of the first inverter, and wherein a reset timer signal is generated on the reset node when the input of the first inverter is charged to high.

23. The SRAM array of claim 21, wherein the second pass gate and fourth pass gate are coupled in parallel.

* * * * *